United States Patent
Gronlund

(10) Patent No.: US 8,433,857 B2
(45) Date of Patent: Apr. 30, 2013

(54) INTERRUPTIBLE WRITE BLOCK AND METHOD FOR USING SAME

(75) Inventor: Christopher Gronlund, Kent, WA (US)

(73) Assignee: Broadcom Corporation, Irvine, CA (US)

( * ) Notice: Subject to any disclaimer, the term of this patent is extended or adjusted under 35 U.S.C. 154(b) by 1479 days.

(21) Appl. No.: 12/069,937

(22) Filed: Feb. 12, 2008

(65) Prior Publication Data

US 2009/0204739 A1  Aug. 13, 2009

(51) Int. Cl.
*G06F 12/00* (2006.01)
*G06F 13/00* (2006.01)
*G06F 13/28* (2006.01)

(52) U.S. Cl.
USPC ........... 711/150; 711/104; 711/108; 711/154; 710/48; 710/264; 365/189.02

(58) Field of Classification Search .................. 711/108, 711/150
See application file for complete search history.

(56) References Cited

U.S. PATENT DOCUMENTS

| | | | | | |
|---|---|---|---|---|---|
| 5,535,397 | A | * | 7/1996 | Durante et al. | 710/267 |
| 5,701,436 | A | * | 12/1997 | Nagashima et al. | 711/162 |
| 5,857,108 | A | * | 1/1999 | Hong | 710/260 |
| 5,931,936 | A | * | 8/1999 | Chung et al. | 710/263 |
| 6,510,480 | B1 | * | 1/2003 | Ito | 710/268 |
| 7,421,528 | B1 | * | 9/2008 | Yin et al. | 710/105 |
| 2004/0230319 | A1 | * | 11/2004 | Musumeci et al. | 700/1 |

* cited by examiner

*Primary Examiner* — Matthew Bradley
*Assistant Examiner* — Prasith Thammavong
(74) *Attorney, Agent, or Firm* — Farjami & Farjami LLP

(57) ABSTRACT

A disclosed embodiment is an interruptible write block comprising a primary register having an input coupled to an input of the interruptible write block, a secondary register having an input selectably coupled to an output of the primary register and to an output of the secondary register through an interrupt circuit. The interrupt circuit is utilized to interrupt flow of new data from the primary register to the secondary register during an interrupt of a write operation, such that upon resumption of the write operation the secondary register contains valid data. A method of utilizing an interruptible write block during a write operation comprises loading data into a primary register, interrupting the write operation to perform one or more other operations, loading the data into a secondary register while loading new data into the primary register, and resuming the write operation using valid data from the secondary register.

20 Claims, 4 Drawing Sheets

US 8,433,857 B2

INTERRUPTIBLE WRITE BLOCK AND METHOD FOR USING SAME

BACKGROUND OF THE INVENTION

1. Field of the Invention

The present invention is generally in the field of electrical circuits and systems. More specifically, the present invention is in the field of memory systems and devices.

2. Background Art

In various memory devices, such as RAMs (random access memory), CAMs (content addressable memory), or other memory devices, that handle a large amount of input data, the number of inputs to the memory device need be managed and reduced to, for example, reduce problems associated with data routing when there are numerous input pins. Moreover, in applications where the write operation throughput is not as important or critical as throughput of other memory device operations, such as read or compare operations, it is beneficial to be able to interrupt the write operation while performing a number of other operations so that system throughput is in effect increased.

However, various problems are encountered when there is an attempt to reduce the number of inputs by spreading a write operation across more than one cycle, e.g. when performing a multi-cycle write operation. One such problem is that while providing for a multi-cycle write operation in effect results in a two-to-one reduction of inputs to a write block of a memory device, interrupting the write operation mid-way, i.e. after passage of only one cycle, could result in corrupt data, i.e. invalid data, being provided to the memory array.

Thus, it is desirable to reduce the number of inputs to a write block in a memory device, such as a RAM or a CAM, by performing a multi-cycle or a multi-cycle write operation, while being able to interrupt the write operation without writing corrupt or invalid data into the memory device.

SUMMARY OF THE INVENTION

An interruptible write block and method for using same, substantially as shown in and/or described in connection with at least one of the figures, and as set forth more completely in the claims.

DETAILED DESCRIPTION OF THE INVENTION

The present invention is directed to an interruptible write block and method for using same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
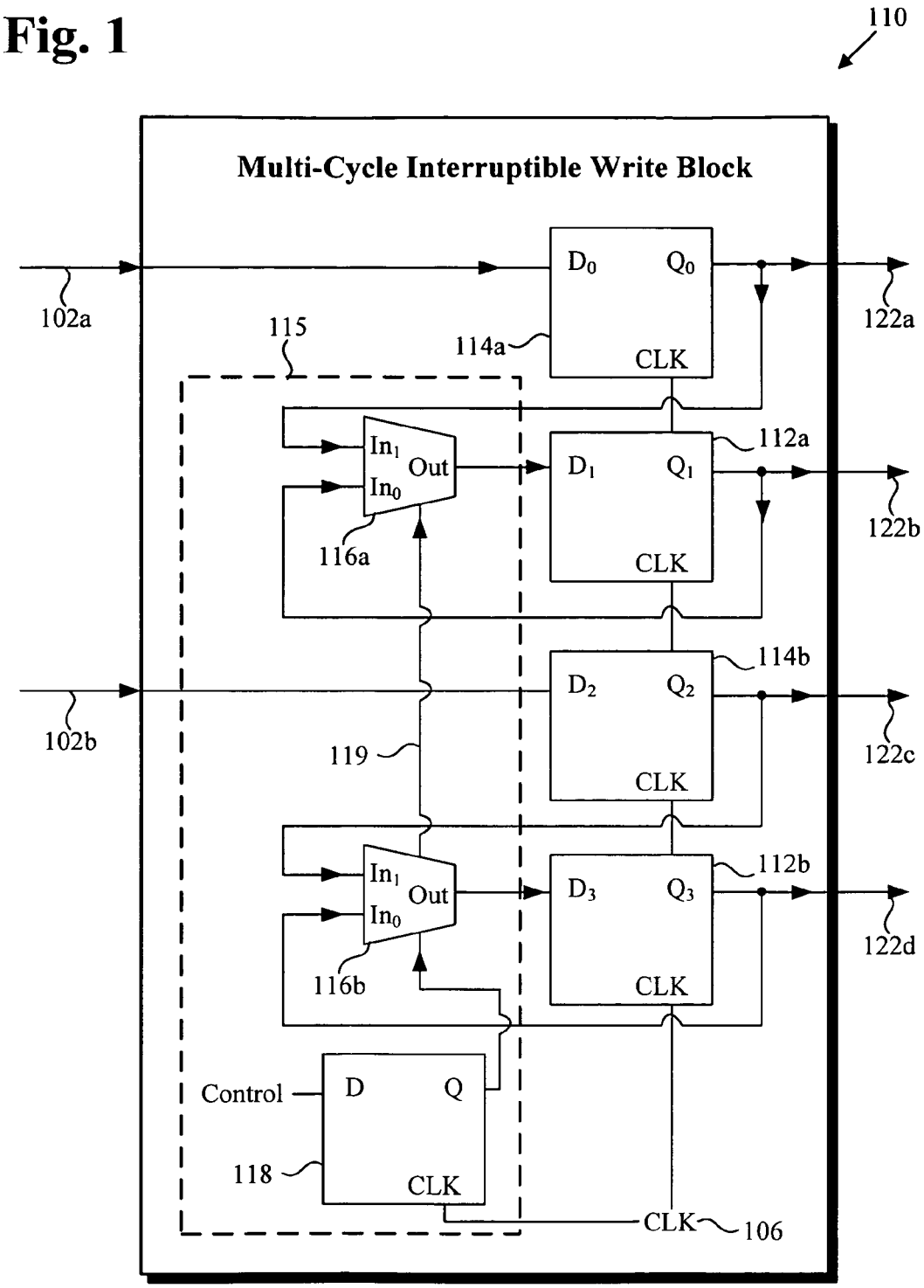
FIG. 1 shows an exemplary multi-cycle interruptible write block including an interrupt circuit, according to one embodiment of the present invention.

FIG. 1 shows exemplary multi-cycle interruptible write block 110 including an interrupt circuit, according to one embodiment of the present invention. Multi-cycle interruptible write block 110 in FIG. 1 can be used in a variety of memory devices, such as CAMs (content addressable memories), RAMs (random access memories), or the like, where it may be important to reduce the number of input pins in order to reduce I/O routing complexity in the memory device. In this exemplary embodiment, multi-cycle interruptible write block 110 comprises inputs 102a and 102b, secondary registers 112a and 112b, primary registers 114a and 114b, and outputs 122a, 122b, 122c, and 122d. Also included in multi-cycle interruptible write block 110, is interrupt circuit 115 including interrupt multiplexers 116a and 116b, control register 118, and select line 119.

As may be seen from FIG. 1, secondary registers 112a and 112b, which may also be referred to as "mask registers" when block 110 is used in a CAM (content addressable memory), for example, and primary registers 114a and 114b, which may also be referred to as "key registers" when block 110 is used in a CAM, are triggered by clock 106. Clock 106 may be a system clock, for example. It is noted that although in the embodiment of FIG. 1, secondary registers 112a and 112b, and primary registers 114a and 114b may comprise D flip-flops that are triggered on the rising edge of the clock, that embodiment is merely exemplary. In other embodiments, secondary registers 112a and 112b, and primary registers 114a, and 114b may comprise D flip-flops that are triggered on the falling edge of the clock or other types of flip-flops or latches can be used.

According to the embodiment of FIG. 1, multi-cycle interruptible write block 110 is configured to receive a first data and a second data at each input 102a and 102b. For the purposes of the present application, the first data will be referred to as "data", and the second data will be referred to as "new data." Multi-cycle interruptible write block 110 includes a secondary register corresponding to each input and a primary register corresponding to each input. This relationship is shown in FIG. 1 by secondary register 112a and primary register 114a corresponding to input 102a, and by secondary register 112b and primary register 114b corresponding to input 102b. For clarity, data flow in multi-cycle interruptible write block 110 will be described for input 102b, primary register 114b, interrupt multiplexer 116b, and secondary register 112b. It should be understood that substantially the same events occur for data and new data received at input 102a and processed through primary register 114a, interrupt multiplexer 116a, and secondary register 112a.

Continuing with FIG. 1, when data is received by multi-cycle interruptible write block 110 at input 102b, that data is routed to input $D_2$ of primary register 114b. At a first rising edge of clock 106 after receipt of the data by multi-cycle interruptible write block 110, the data may be loaded into primary register 114b and made available at output $Q_2$. As can be seen in FIG. 1, output $Q_2$ is routed to output 122c and to input $In_1$ to interrupt multiplexer 116b. With select line 119 from control register 118 providing an ON signal to interrupt multiplexer 116b, the $Q_2$ output is routed through interrupt multiplexer 116b to input $D_3$ of secondary register 112b. In that instance, a subsequent rising edge of clock 106 will result in the data being loaded into secondary register 112b, while a new data having been received at input 102b and routed to input $D_2$ is loaded into secondary register 114b, thus providing a pair of data comprising the data and the new data as outputs from multi-cycle interruptible write block 110 at respective outputs 122d and 122c.

The preceding paragraph describes an uninterrupted write operation. However, inclusion of interrupt circuit 115 in FIG. 1 permits a write operation of multi-cycle interruptible write block 110 to be interrupted by one or more other operations without loss or corruption of the data already loaded. As an example, consider the case where multi-cycle interruptible write block 110 is utilized as an input interface to a CAM array. Because a CAM is typically called upon to perform compare operations in addition to more common read and write memory operations, loading of multiple data in a write operation spanning multiple clock cycles may be interrupted by a compare operation, for example.

According to the embodiment of FIG. 1, if upon receipt of data at inputs 102a and 102b select line 119 is in an ON state, respective $In_1$ inputs of interrupt multiplexers 116a and 116b are passed on to the outputs of the multiplexers. Where data and new data are sequentially received by multi-cycle interruptible write block 110 at input 102b, for example, the data is loaded into primary register 114b during a first cycle of system clock 106. The data is then multiplexed into secondary register 112b by interrupt multiplexer 116b as the new data is concurrently loaded into primary register 114b, during a second cycle of system clock 106.

Execution of a compare or read operation, on the other hand, requires a write interrupt and would produce an OFF control signal on select line 119, resulting in output from interrupt multiplexers 116a and 116b of their respective $In_0$ inputs. Thus, as further discussed below, when a compare or read operation is performed between receipt of the data and the new data, the received data can be preserved in an uncorrupted state. Because a compare operation produces an OFF control signal on select line 119, a subsequent clock cycle results in reloading of the data from secondary register 112b back into the same register, i.e. into secondary register 112b, through feedback into the $In_0$ input to interrupt multiplexer 116b. Thus, the states of primary and secondary registers are unchanged during an interrupt, and the write operation can resume with uncorrupted data, i.e. with valid data, upon resumption of the write operation. As a result, one or more system operations, such as a compare operation or a read operation, may occur between receipt of data and new data at the inputs of block 110, without losing or corrupting the data stored in secondary register 112b of multi-cycle interruptible write block 110.

When new data is received at input 102b at some later time, that new data may be loaded into primary register 114b, while the data in secondary register 112b is once again cycled back into secondary register 112b through the $In_0$ input to interrupt multiplexer 116b. Thus, interrupt circuit 115, and more specifically select line 119 of interrupt multiplexer 116b, may be utilized to interrupt flow of the new data from primary register 114b to secondary register 112b during interruption of the write operation, such that upon resumption of the write operation the secondary register contains valid data. As a result, a pair of data comprising the data and the new data may be made concurrently available as outputs from multi-cycle interruptible write block 110 at respective outputs 122d and 122c. A similar series of operations may result in a data and a new data received at input 102a being provided as respective outputs 122b and 122a.

Although in the embodiment of FIG. 1, interrupt circuit 115 is shown to comprise interrupt multiplexers 116a and 116b, as well as control register 118 and select line 119, that representation is once again merely exemplary. In another embodiment, interrupt circuit 115 may comprise a secondary clock in place of interrupt multiplexers 116a and 116b, control register 118, select line 119, and feedback into respective inputs $In_0$ of interrupt multiplexers 116a and 116b. In that embodiment, the secondary clock may by used to selectively trigger secondary registers 112a and 112b, while system clock 106 might continue to trigger primary registers 114a and 114b. The control provided by a secondary clock may be utilized to interrupt flow of the new data from the primary registers to the secondary registers during interruption of the write operation so as to result in selective loading of data into the secondary registers at appropriate times.

Thus, the embodiment of FIG. 1 utilizes two sets of input registers and an interrupt circuit to load first and second data, i.e. data and new data, received at each input of multi-cycle interruptible write block 110 over the course of two clock cycles that need not be sequential. As a result, the particular embodiment shown by multi-cycle interruptible write block 110, in FIG. 1, is capable of receiving two data through each input and supplying two data outputs for each input, thereby providing a two-to-one reduction in the number of inputs required to accommodate data routing through multi-cycle interruptible write block 110. As may be apparent from FIG. 1, additional reductions in the number of inputs may be achieved by introducing additional sets of input registers, for example respective third and fourth input registers in addition to the primary and secondary registers, and loading corresponding third and fourth data into those registers during additional clock cycles. Thus, more generally, interruptible write block 110 in FIG. 1 is capable of selectively reducing the number of data inputs required for data processing by receiving multiple data through each input over multiple clock cycles.

Figure 2:
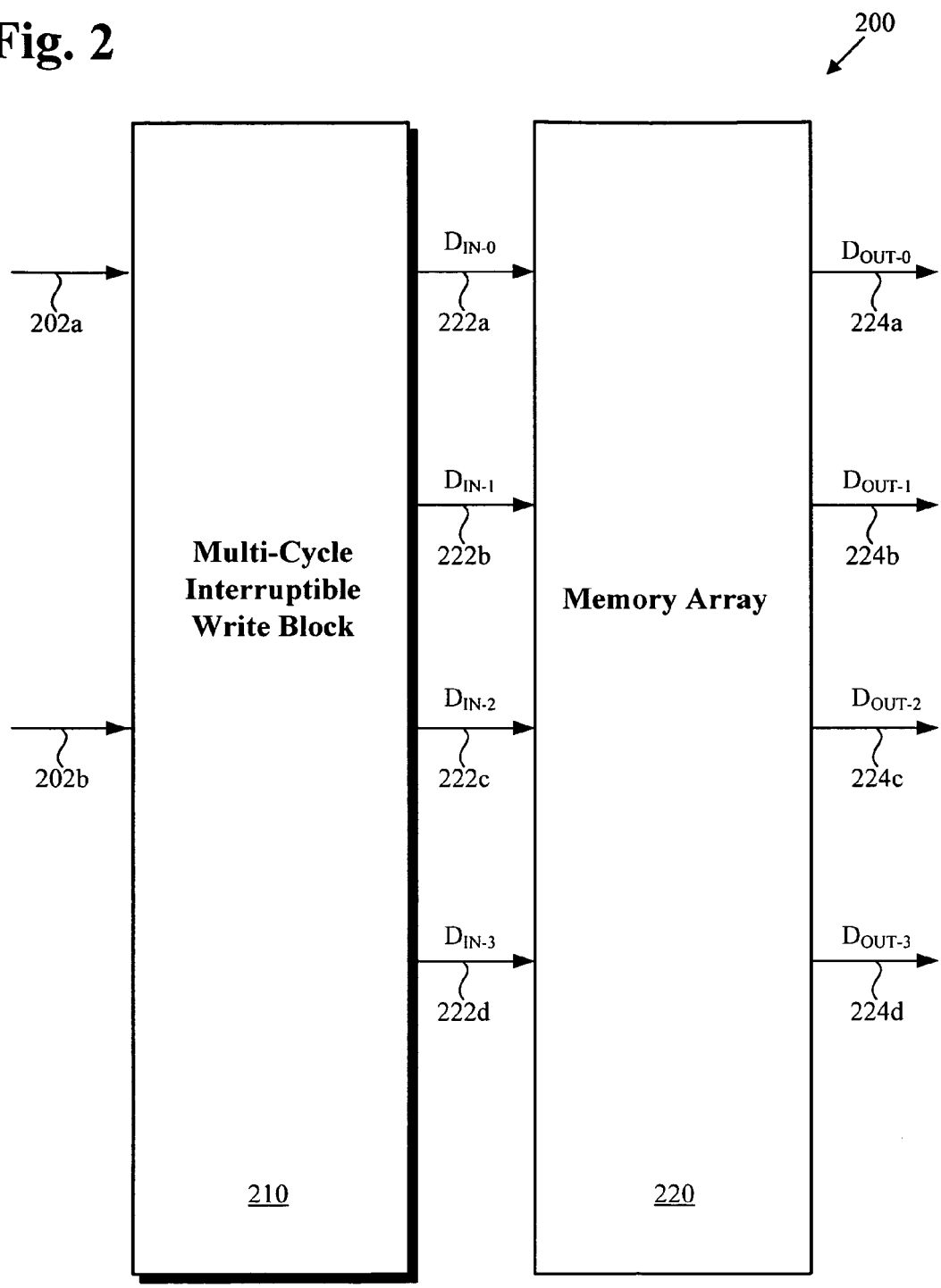
FIG. 2 shows a block diagram of a system utilizing a multi-cycle interruptible write block to reduce the number of inputs to a memory array, according to one embodiment of the present invention.

Turning to FIG. 2, FIG. 2 shows a block diagram of a system utilizing a multi-cycle interruptible write block to reduce the number of inputs to a memory array, according to one embodiment of the present invention. System 200 in FIG. 2 comprises multi-cycle interruptible write block 210 and memory array 220. Multi-cycle interruptible write block 210 receiving inputs 202a and 202b, and providing outputs 222a, 222b, 222c, and 222d, corresponds to multi-cycle interruptible write block 110 receiving inputs 102a and 102b, and providing outputs 122a, 122b, 122c, and 122d, in FIG. 1.

As may be seen from system 200, memory array 220 is configured to receive the data and new data arriving at inputs 202a and 202b of multi-cycle interruptible write block 210, as outputs 222a, 222b, 222c, and 222d from multi-cycle interruptible write block 210. The data and new data received from multi-cycle interruptible write block 210 are shown in system 200 as inputs $D_{IN-0}$, $D_{IN-1}$, $D_{IN-2}$, and $D_{IN-3}$ to memory array 220. Also shown in FIG. 2 are memory array outputs 224a, 224b, 224c, and 224d, comprising memory array output data $D_{OUT-0}$, $D_{OUT-1}$, $D_{OUT-2}$, and $D_{OUT-3}$, respectively. As shown in FIG. 2, when multi-cycle interruptible write block 210 is implemented as an input interface to memory array 220, which may be a CAM array or RAM array, for example, multi-cycle interruptible write block 210 advantageously enables a two-to-one reduction in the number of inputs, while preserving the ability to properly interrupt a write operation.

Figure 3:
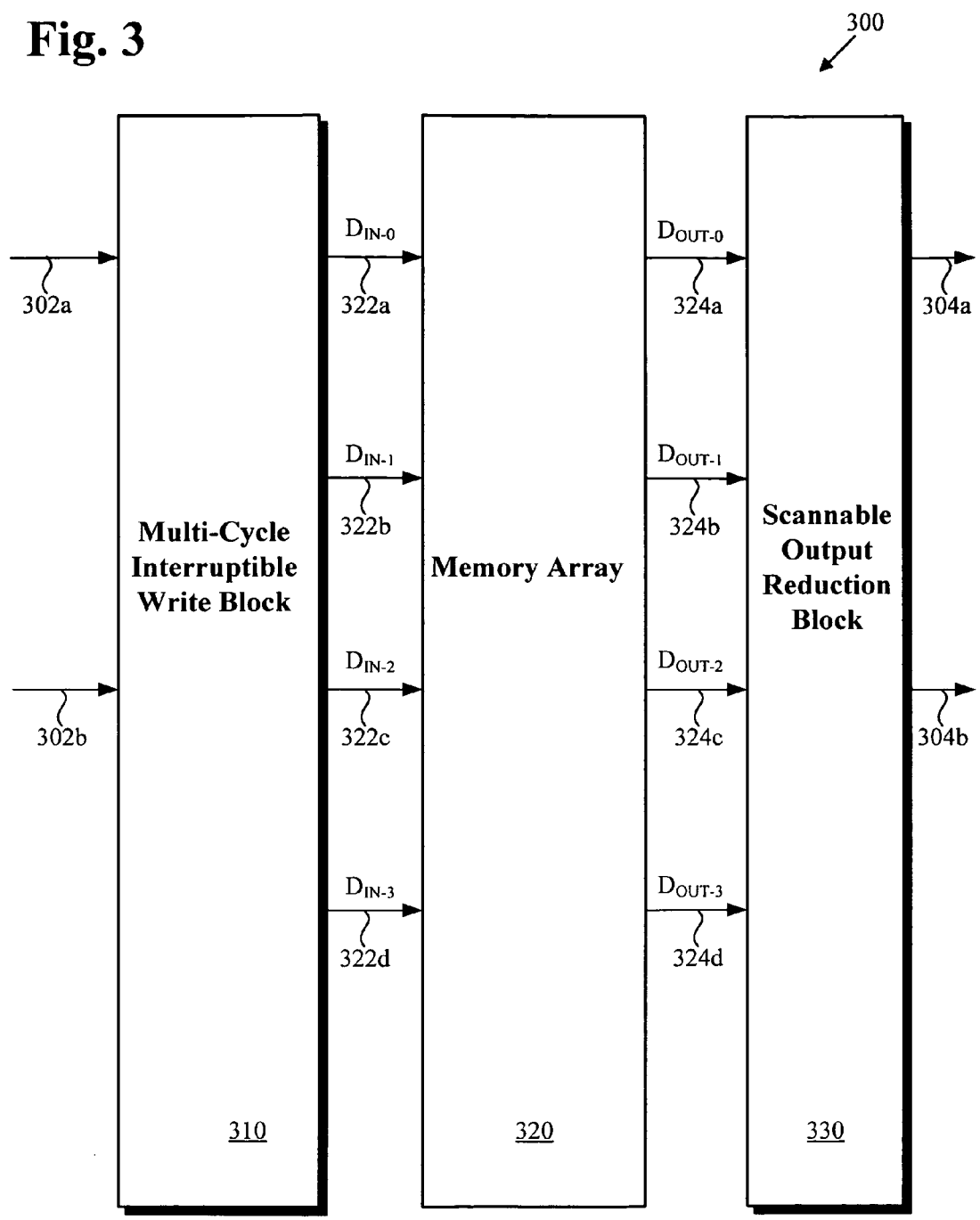
FIG. 3 shows a block diagram of a system utilizing a multi-cycle interruptible write block to reduce the number of inputs to a memory array, including a scannable output reduction block, according to one embodiment of the present invention.

FIG. 3 shows a block diagram of a system utilizing a multi-cycle interruptible write block to reduce the number of inputs to a memory array, including a scannable output reduction block, according to one embodiment of the present invention. System 300 in FIG. 3 comprises multi-cycle interruptible write block 310, memory array 320, and scannable output reduction block 330. Multi-cycle interruptible write block 310 receiving inputs 302a and 302b, and providing outputs 322a, 322b, 322c, and 322d, corresponds to multi-cycle interruptible write block 110 receiving inputs 102a and 102b, and providing outputs 122a, 122b, 122c, and 122d in FIG. 1. Memory array 320, in FIG. 3, receiving inputs $D_{IN-0}$, $D_{IN-1}$, $D_{IN-2}$, and $D_{IN-3}$, and providing outputs 324a, 324b, 324c, and 324d, comprising output data $D_{OUT-0}$, $D_{OUT-1}$, $D_{OUT-2}$ and $D_{OUT-3}$ respectively, corresponds to memory array 220 in FIG. 2.

As shown in FIG. 3, scannable output reduction block 330 receives outputs 324a, 324b, 324c, and 324d from memory array 320, and provides system outputs 304a and 304b. As a result, output data $D_{OUT-0}$ and $D_{OUT-1}$, and $D_{OUT-2}$ and $D_{OUT-3}$ may be read from memory array 320 using scannable output reduction block 330. Scannable output block 330, in FIG. 3, is configured to selectively reduce the number of outputs from memory array 320.

When utilized in combination with multi-cycle interruptible write block 310, scannable output reduction block 330 is capable of producing a reduction in the outputs from memory array 320, thus providing system 300 with a routing solution enabling greater data throughput efficiency. Although in the embodiment of FIG. 3, the reduction in outputs provided by scannable output reduction block 330 matches the reduction in inputs provided by multi-cycle interruptible write block 310, in other embodiments, the input and output reduction need not match.

Figure 4:
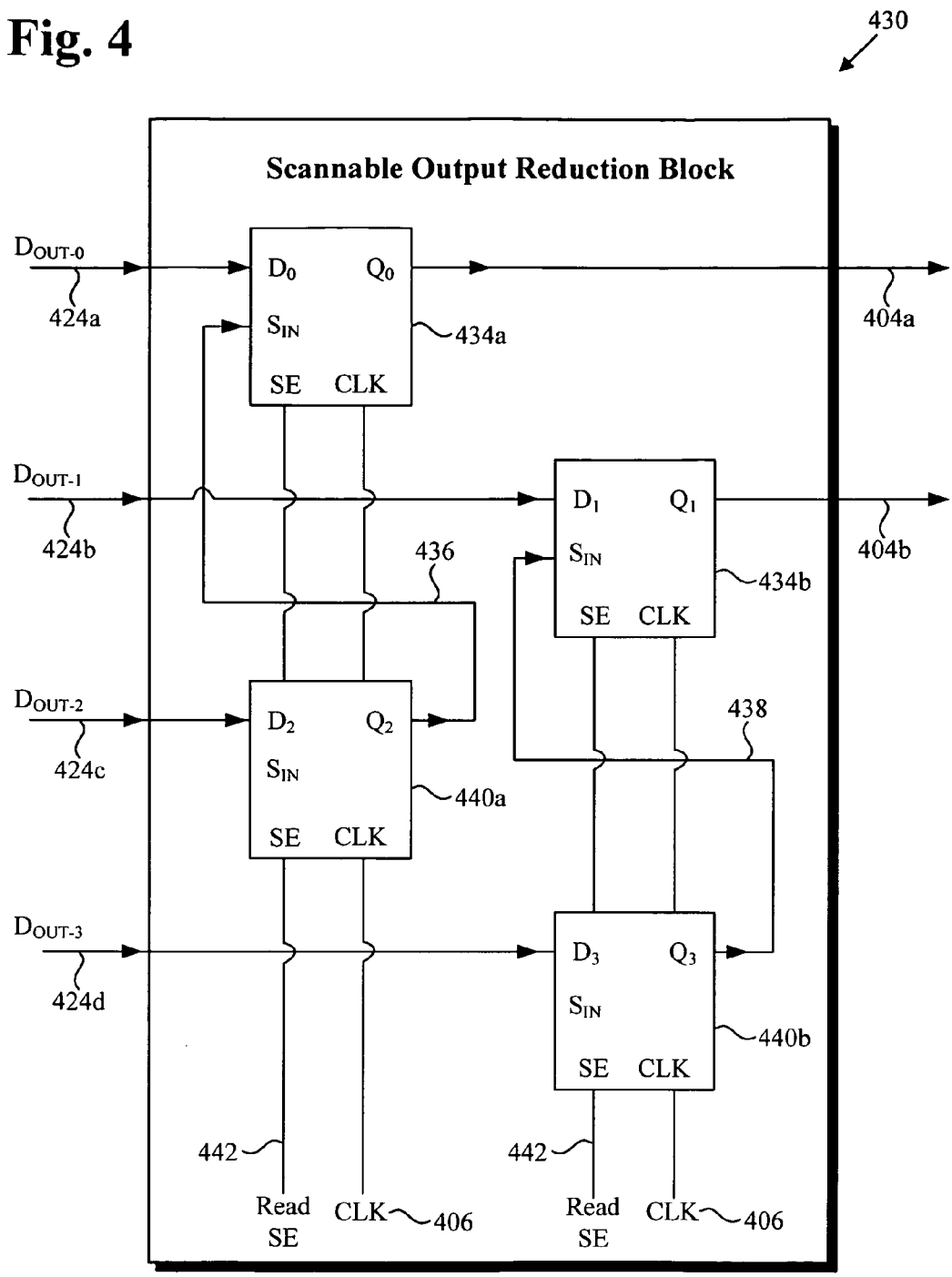
FIG. 4 shows an exemplary scannable output reduction block suitable for use in the system of FIG. 3, according to one embodiment of the present invention.

Turning now to FIG. 4, FIG. 4 shows an exemplary scannable output reduction block suitable for use in system 300 of FIG. 3, according to one embodiment of the present invention. Scannable output reduction block 430 receiving output data $D_{OUT-0}$, $D_{OUT-1}$, $D_{OUT-2}$, and $D_{OUT-3}$ from a memory array (not shown in FIG. 4), and providing outputs 404a and 404b, corresponds to scannable output reduction block 330 receiving output data $D_{OUT-0}$, $D_{OUT-1}$, $D_{OUT-2}$, and $D_{OUT-3}$ from memory array 320 and providing system outputs 304a and 304b in FIG. 3.

Scannable output reduction block 430 in FIG. 4 comprises inputs 424a, 424b, 424c, 424d, first output register 434a, second output register 434b, first primary scan chain register 440a, and second primary scan chain register 440b. First output register 434a, second output register 434b, first primary scan chain register 440a, and second primary scan chain register 440b may be D flip-flops, for example. Also included in scannable output reduction block 430 are outputs 404a and 404b, clock 406, and Read SE control line 442. As shown in FIG. 4, first output register 434a, second output register 434b, first primary scan chain register 440a, and second primary scan chain register 440b are triggered by clock 406, which may be a system clock corresponding to clock 106 in FIG. 1, for example. As further shown in FIG. 4, first output register 434a, second output register 434b, first primary scan chain register 440a, and second primary scan chain register 440b are controlled by Read SE control line 442, which determines whether the respective registers are loaded by memory array output data provided at inputs $D_0$, $D_1$, $D_2$, and $D_3$, or scanned in as inputs to $S_{IN}$.

According to the embodiment of FIG. 4, scannable output reduction block 430 contains two scan chains, each corresponding to an output of scannable output reduction block 430, and each including one output register and a primary scan chain register. First output register 434a and first primary scan chain register 440a, linked by scan line 436, comprise a first scan chain corresponding to output 404a, while second output register 434b and second primary scan chain register 440b, linked by scan line 438, comprise a second scan chain corresponding to output 404b. It is noted that this is a purely exemplary arrangement, however. In other embodiments, scannable output reduction block 430 can have more scan chains corresponding to more outputs, and each scan chain may include additional scan chain registers. For example, in one exemplary embodiment, a scannable output reduction block may comprise eight scan chains, each including an output register, primary scan chain register, secondary scan chain register, and tertiary scan chain register. It is further noted that although in the present embodiment the number of registers included in a scan chain matches the number of scan chains in scannable output reduction block 430, and in other embodiments that may not be the case.

Continuing with FIG. 4, when output data corresponding respectively to $D_{OUT-0}$ and $D_{OUT-1}$, and $D_{OUT-2}$ and $D_{OUT-3}$ is received by scannable output reduction block 430, $D_{OUT-0}$ and $D_{OUT-1}$ are routed to respective first and second output registers 434a and 434b, while $D_{OUT-2}$ and $D_{OUT-3}$ are routed to respective first primary scan chain registers 440a and 440b. During a first read cycle, triggered by clock 406, first and second output registers 434a and 434b provide $D_{OUT-0}$ and $D_{OUT-1}$ at respective outputs 404a and 404b. In addition, first and second primary scan chain register 440a and 440b deliver $D_{OUT-2}$ and $D_{OUT-3}$ to the respective $S_{IN}$ inputs of first and second output registers 434a and 434b. Read SE control line 442, which may initially be LOW to allow data input to the respective registers at $D_0$, $D_1$, $D_2$, and $D_3$, goes HIGH during the first read cycle. As a result, during a second read cycle triggered by clock 406, $D_{OUT-2}$ and $D_{OUT-3}$ are read from outputs 404a and 404b of scannable output reduction block 430.

As can be seen from FIG. 4, the present embodiment enables a two-to-one reduction in the outputs from a memory array. In other embodiments utilizing scan chains having more numerous scan chain registers, the output reduction can be correspondingly greater. According to the embodiment of FIG. 4, reductions in output come at the expense of additional cycle time, as the second pair of output data are first scanned into the output registers prior to being read out during a subsequent read cycle. This approach may prove advantageous, however, for example in a RAM performing proportionally more write operations than read operations, or in a CAM capable of performing a compare operation concurrently with a read cycle.

By specifically describing an interruptible write block capable of loading multiple data through a single input, the present invention provides a data routing implementation capable of selectively reducing the number of inputs to an electronic system, such as a memory array. Moreover, by enabling interruption of a multi-cycle data loading process, the present disclosure describes an approach that advantageously preserves response time for other system operations. By further providing a scannable output reduction block capable of delivering multiple output data from a single output, the present invention provides a system and method enabling reductions to both data inputs and data outputs. As a result, the present invention presents a data routing solution that successfully enables interruptible write while providing advantageous throughput efficiencies.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, an interruptible write block and method for using same have been described.

The invention claimed is:

1. An interruptible write block comprising:
a primary register coupled to an input of said interruptible write block;
a secondary register having an input coupled to an output of an interrupt circuit, said output of said interrupt circuit being selected from an output of said primary register and an output of said secondary register, wherein said interrupt circuit is utilized to interrupt flow of new data from said primary register to said secondary register during an interrupt of a write operation, such that upon resumption of said write operation said secondary register contains valid data.

2. The interruptible write block of claim 1, wherein said interrupt circuit comprises an interrupt multiplexer, wherein a select line of said interrupt multiplexer is utilized to interrupt flow of said new data from said primary register to said secondary register during said interrupt of said write operation.

3. The interruptible write block of claim 1 utilized in a system to reduce the number of inputs to a memory array in said system.

4. The interruptible write block of claim 3, wherein said memory array comprises a CAM (content addressable memory).

5. The interruptible write block of claim 3, wherein said memory array comprises a RAM (random access memory).

6. The interruptible write block of claim 3, wherein said system further comprises a scannable output reduction block configured to receive output data from said memory array.

7. The interruptible write block of claim 6, wherein said memory array comprises a CAM (content addressable memory).

8. The interruptible write block of claim 6, wherein said memory array comprises a RAM (random access memory).

9. An interruptible write block comprising:
a key register coupled to an input of said interruptible write block;
a mask register having an input coupled to an output of an interrupt circuit, said output of said interrupt circuit being selected from an output of said key register and an output of said mask register, wherein said interrupt circuit is utilized to interrupt flow of new data from said key register to said mask register during an interrupt of a write operation, such that upon resumption of said write operation said mask register contains valid data.

10. The interruptible write block of claim 9, wherein said interrupt circuit comprises an interrupt multiplexer, wherein a select line of said interrupt multiplexer is utilized to interrupt flow of said new data from said key register to said mask register during said interrupt of said write operation.

11. The interruptible write block of claim 9 utilized in a system to reduce the number of inputs to a memory array in said system.

12. The interruptible write block of claim 11, wherein said memory array comprises a CAM (content addressable memory).

13. The interruptible write block of claim 11, wherein said memory array comprises a RAM (random access memory).

14. The interruptible write block of claim 11, wherein said system further comprises a scannable output reduction block configured to receive output data from said memory array.

15. The interruptible write block of claim 14, wherein said memory array comprises a CAM (content addressable memory).

16. The interruptible write block of claim 14, wherein said memory array comprises a RAM (random access memory).

17. A method of utilizing an interruptible write block with a memory array during a write operation, said method comprising steps of:
loading data received at an input to said interruptible write block into a primary register of said interruptible write block;
interrupting said write operation to perform a desired operation in said memory array;
loading said data into a secondary register of said interruptible write block and loading new data into said primary register;
resuming said write operation using valid data from said secondary register.

18. The method of claim 17, wherein said interrupting step is implemented using an interrupt multiplexer.

19. The method of claim 17, wherein said memory array comprises a CAM (content addressable memory).

20. The method of claim 17, wherein said memory array comprises a RAM (random access memory).

* * * * *